United States Patent [19]
Crowley et al.

[11] Patent Number: 5,694,044
[45] Date of Patent: Dec. 2, 1997

[54] SIMULTANEOUS SURGE TEST OF TWO COILS OF AN ASSEMBLY OF SERIES CONNECTED COILS

[75] Inventors: John Llewellyn Crowley, Beavercreek; John David Painter, Wilmington; James Timothy Dillon, Kettering; David Allan Boyer, Miamisburg; James Allen Fisher, Dayton; James Hubert Walters; Donald Christopher Leonard, both of Beavercreek, all of Ohio

[73] Assignee: Fisher Data Products, Inc., Dayton, Ohio

[21] Appl. No.: 559,166

[22] Filed: Nov. 13, 1995

[51] Int. Cl.[6] .................................................. G01R 31/06
[52] U.S. Cl. .......................... 324/546; 324/545; 324/551; 324/772; 324/524
[58] Field of Search ........................... 324/388, 509, 324/520, 522, 523, 527, 536, 545, 546, 547, 551, 654, 656, 772; 340/646, 647

[56] References Cited

U.S. PATENT DOCUMENTS

| | | | |
|---|---|---|---|
| 3,017,571 | 1/1962 | Moricca et al. | 324/546 |
| 3,045,177 | 7/1962 | Weed | 324/546 |
| 3,307,102 | 2/1967 | Norkaitis | 324/545 |
| 3,659,197 | 4/1972 | Alley et al. | 324/546 |
| 3,742,346 | 6/1973 | Specht | 324/546 |
| 3,869,664 | 3/1975 | Safer et al. | 324/546 |
| 3,887,866 | 6/1975 | Safer et al. | 324/546 |
| 3,887,867 | 6/1975 | Safer et al. | 324/546 |
| 3,932,806 | 1/1976 | Kawada | 324/546 |
| 4,746,859 | 5/1988 | Schrag et al. | 324/546 |
| 5,256,977 | 10/1993 | Domenichini et al. | 324/546 |
| 5,506,508 | 4/1996 | Zimmermann | 324/546 |

Primary Examiner—Ernest F. Karlsen
Assistant Examiner—Diep Do

[57] ABSTRACT

A circuit detects insulation defects in a coil assembly including a plurality of series connected coils. A first voltage pulse is applied to a first coil of the coil assembly, a second voltage pulse is applied to a second coil of the coil assembly, the first and second coils being substantially diametrically opposite to one another, and the first and second voltage pulses being substantially equal to one another and oppositely poled relative to the coil assembly. A first voltage waveform across the first coil is monitored, and a second voltage waveform across the second coil is monitored. A first signal is derived from the first voltage waveform, a second signal is derived from the second voltage waveform, and a differential percentage value based on the first signal and the second signal is computed. An insulation defect is then determined based upon the differential percentage value.

14 Claims, 2 Drawing Sheets

SIMULTANEOUS SURGE TEST OF TWO COILS OF AN ASSEMBLY OF SERIES CONNECTED COILS

BACKGROUND OF THE INVENTION

The present invention relates in general to testing of electric components having a plurality of series connected wound coils, and, more particularly, to simultaneously testing two coils of such components to both speed up testing and improve testing sensitivity. While the invention is generally applicable to such electrical components, it will be described herein with reference to electrical armatures to test for insulation defects, shorted commutator bars and the like for which it is being used initially.

A common procedure for determining various defects in wound coils is known as a "surge test." An apparatus for performing a surge test is illustrated in FIG. 1, wherein a high voltage pulse is applied to a coil winding 10 by charging a capacitor 12 via a charging circuit 22 and then activating a firing circuit 24 to connect the charged capacitor 12 across the coil winding 10 through a high voltage silicon controlled rectifier (SCR) 14. The high voltage 26 on the capacitor 12, shown in FIG. 2, creates an oscillation within the circuit including a resistance 8, the coil 10 and the capacitor 12. The resistance 8 represents resistance of the coil 10, wiring within the circuit and any additional resistance which may be provided to prevent excessive current flow within the circuit. The damped oscillating waveform created by the excited RLC circuit is measured across the coil 10 and shown in FIG. 2. In the illustrated prior art surge test, only the negative portion of the waveform 16 is subject to integration in a measurement circuit 20, which may be an RC integration circuit (not shown). The resulting output voltage of the measuring circuit 20 is basically the product of applied voltage and time (Volt-Seconds) and can be used to determine whether the coil is defective or not. In the case of an armature made up of a plurality of series connected coils, the armature or test circuit is indexed until all coils of the circuit have been tested.

Unfortunately, for armatures having a large number of coils or which are rapidly manufactured, such indexing results in delay in the manufacturing process.

Thus, there is a need for improved testing of electrical components having multiple series connected windings, such as armatures, which speeds up the testing operation. Preferably, such improved testing would also provide greater sensitivity to further improve the testing procedure.

SUMMARY OF THE INVENTION

This need is met by the present invention wherein a method and apparatus are provided for surge testing two substantially diametrically opposed coils in a coil assembly at the same time. Test signals representative of both coils being tested are generated and combined to derive a differential percentage value resulting in improved testing sensitivity.

In accordance with one aspect of the present invention, a method for detecting insulation defects in a coil assembly including a plurality of series connected coils comprises the steps of: applying a first voltage pulse to a first coil of the coil assembly; applying a second voltage pulse to a second coil of the coil assembly, the first and second coils being substantially diametrically opposite to one another, and the first and second voltage pulses being substantially equal to one another and oppositely poled relative to the coil assembly; monitoring a first voltage waveform across the first coil; monitoring a second voltage waveform across the second coil; forming a first signal from the first voltage waveform; forming a second signal from the second voltage waveform; computing a differential percentage value based on the first signal and the second signal; and, determining an insulation defect based upon the differential percentage value.

The coil assembly may be indexed until all coils of the coil assembly have been pulsed and differential percentage values for each index of the coil assembly may be stored. At least one of the differential percentage values then may be compared to a predetermined differential percentage limit value to determine an insulation defect in the coil assembly based on the comparison.

Preferably, a maximum differential percentage value is selected from all stored differential percentage values, and the maximum-differential percentage value is compared to the predetermined differential percentage limit value to determine an insulation defect in the coil assembly.

The steps of applying a first voltage pulse to the first coil of the coil assembly and applying a second voltage pulse to a second coil of the coil assembly may comprise the steps of: charging a first capacitor; charging a second capacitor, the first and second capacitors being charged by a common charge source; and, simultaneously connecting the first capacitor across the first coil of the coil assembly and the second capacitor across the second coil of the coil assembly through a common switching device.

Additionally, the steps of forming the first and second signals may comprise the steps of rectifying and integrating the first and second waveforms, respectively. Further, the steps of computing, comparing, and determining may be performed by a microprocessor. Also, a predetermined differential limit value may be selected so as to be indicative of a maximum surge differential limit for a coil assembly.

In accordance with another aspect of the present invention, an apparatus for testing a coil assembly including a plurality of series connected coils comprises a first capacitor having first and second terminals and a second capacitor having first and second terminals. The first terminal of the first capacitor is connectable to a first side of a first coil of the coil assembly and the first terminal of the second capacitor is connectable to a first side of a second coil of the coil assembly. The second terminals of the first and second capacitors are connected to one another at a junction point. A common charging circuit is connected to the first and second capacitors for charging the first and second capacitors. The first terminal of the switching device is connected to the junction point, and a second terminal of the switching device is connected to a second side of the first coil and a second side of the second coil. The first and second capacitors are poled such that, when the second terminals of the first and second capacitors are connected to the second sides of the first and second coils through the switching device, capacitor discharge voltages applied to the first and second coils oppose one another within the coil assembly. A first measurement circuit is connectable to the first coil and a second measurement circuit is connectable to the second coil. A controller provides for control of the common charging circuit and the switching device, and for receipt and analysis of signals generated by the first and second measurement circuits to identify insulation defects in the coil assembly. The first and second measurement circuits may each comprise a rectifier circuit and an integrator circuit. Further, the controller may comprise a microprocessor.

In accordance with yet another aspect of the present invention, a method for testing a coil assembly including a plurality of series connected coils comprises the steps of: connecting a first voltage pulse across a first coil of the coil assembly; simultaneously connecting a second voltage pulse across a second coil of the coil assembly, the first and second voltage pulses being poled to oppose each other within the coil assembly; rectifying and integrating the resulting oscillatory signal generated across the first coil to generate a first signal; rectifying and integrating the resulting oscillatory signal generated across the second coil to generate a second signal; subtracting the second signal from the first signal and dividing the result by the larger of the first and second signals to obtain a differential percentage value for the first and second coils; and, determining an insulation defect in the coil assembly based on the differential percentage value.

The method may further comprise the steps of: indexing the coil assembly until all coils of the coil assembly have been connected to the first or second voltage pulse; storing differential percentage values for each index of the coil assembly; comparing at least one of the differential percentage values to a predetermined differential percentage limit value; and, determining an insulation defect in the coil assembly based on the comparison.

A maximum differential percentage value may be selected from all stored differential percentage values, and the maximum differential percentage value may be compared to the predetermined differential percentage limit value, the step of determining an insulation defect in the coil assembly is then based on the comparison.

The steps of connecting a first voltage pulse across a first coil of the coil assembly and simultaneously connecting a second voltage pulse across a second coil of the coil assembly may comprise the steps of: charging a first capacitor; charging a second capacitor, the first and second capacitors being charged by a common charge source; and, simultaneously connecting the first capacitor across the first coil of the coil assembly and the second capacitor across the second coil of the coil assembly through a common switching device.

Accordingly, it is an object of the present invention to provide a coil assembly diagnostic test which more rapidly tests coil assemblies and also has increased sensitivity to defects within coils of the coil assembly. Other objects and advantages of the present invention will be apparent from the following description, the accompanying drawings, and the appended claims.

DETAILED DESCRIPTION OF THE INVENTION

Figure 3:
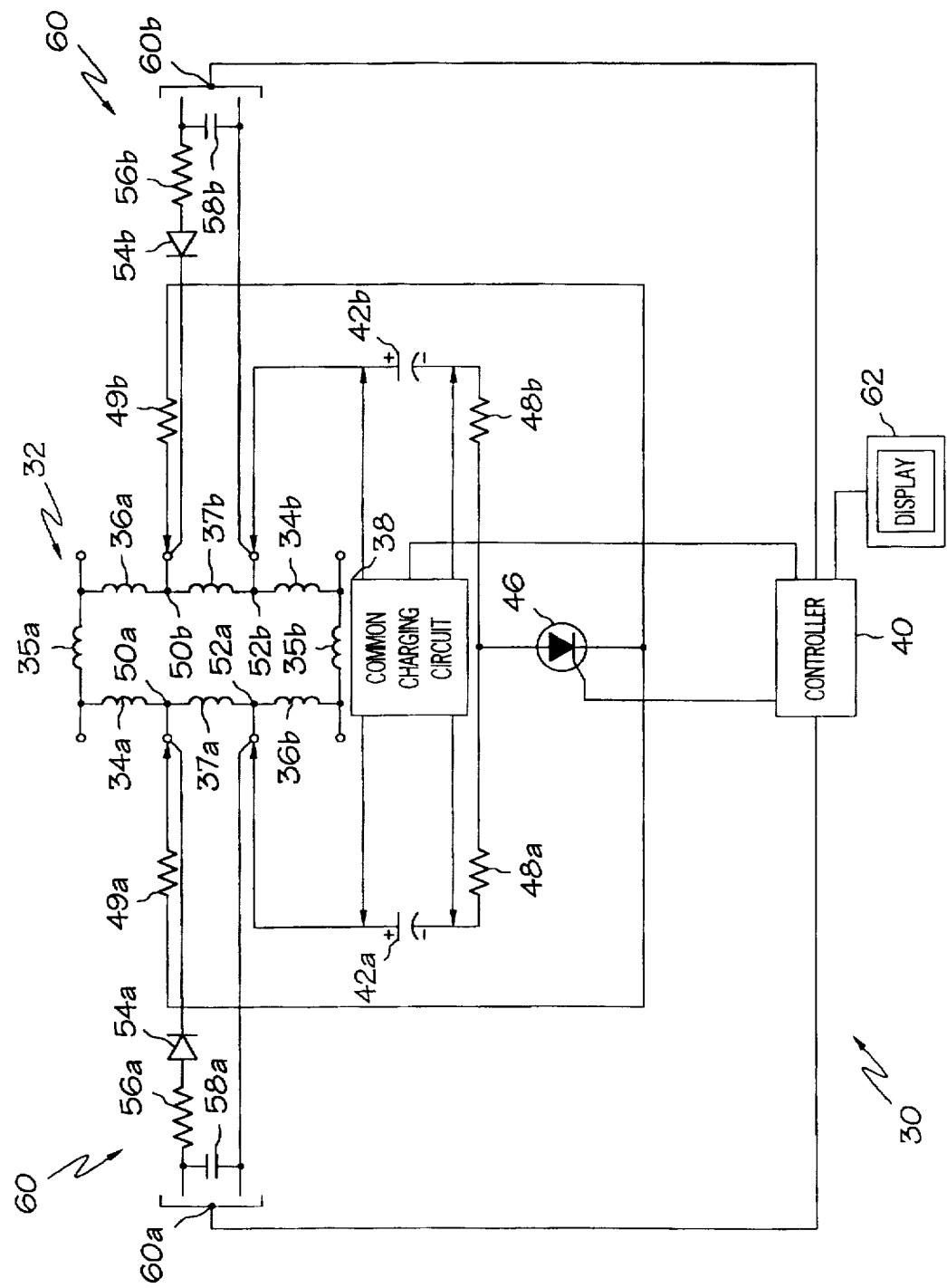
FIG. 3 is a schematic block diagram of the coil surge testing circuit of the present invention.

A testing circuit 30 operable in accordance with the present invention is illustrated in FIG. 3. A coil assembly 32 to be tested includes a plurality of coils 34a, 34b, 35a, 35b, 36a, 36b, 37a and 37b. Diametrically opposite coils are like numbered, e.g., 34a and 34b, because of their opposed positions within the coil assembly, i.e., the same number of coils lie between the diametrically opposite coils on both sides of each coil. For example, between coils 37a and 37b, on one side, lie the three coils 34a, 35a, and 36a, and on the other side, lie the three coils 34b, 35b, and 36b.

A common charging circuit 38, is controlled by a controller 40, which may be a conventional programmed microprocessor. The common charging circuit 38 charges a first capacitor 42a and a second capacitor 42b. A single silicon controlled rectifier (SCR) 46 is actuated by a control signal from the controller 40 to connect the first capacitor 42a across a first coil, coil 37a for the index position shown, and to connect the second capacitor 37b across a second coil, coil 37b for the illustrated index position: These connections result in oscillating discharge currents flowing through the first RLC circuit comprising resistors 48a & 49a, the coil 37a, and the capacitor 42a, and through the second RLC circuit comprising resistors 48b & 49b, the coil 37b, and the capacitor 42b. The values of the first and second capacitors 42a, 42b are determined as a function of the resistances of the coils to be tested. The following values are currently preferred:

| COIL RESISTANCE (Ohms) | CAPACITOR 42a, 42b (Microfarad) |
| --- | --- |
| <0.01 | 0.5 |
| 0.01 to .1 | 0.1 |
| 0.1 to 1.0 | 0.02 |
| 1.0 to 10 | 0.005 |
| 10 to 100 | 0.001 |

The resistance values of the resistors 48a, 48b, 49a, 49b, are chosen to limit current flow within the test circuit and thereby prevent damage due to testing defective coils. The values of the resistors 48a and 48b are substantially equal as are the values of the resistors 49a and 49b.

The diametrically opposite coils 37a, 37b are pulsed, or "surged," at the same time because a single SCR controls the discharge of both the capacitors 42a, 42b through both the coils 37a, 37b. The simultaneous surging has the effect of normalizing other variables in the system, such as power line level, computer timing, or stray magnetic fields, because both the coils 37a and 37b are surged under the same conditions. It is contemplated by the present invention that switching devices other than a SCR may be used as long as it provides for simultaneous coil pulsing. Further, while diametrically opposed coils are shown as being tested for each index position of the coil assembly 32, if a coil assembly includes an odd number of coils, substantially diametrically opposite coils are tested.

Since the capacitors 42a, 42b are poled as shown in FIG. 3, upon pulsing, current flows through the opposite coils in opposite directions within the coil assembly 32, as shown in FIG. 3. As a result, absent coil defects, substantially identical potentials exist at points 50a and 50b in the coil assembly 32. Similarly, substantially identical potentials exists at points 52a and 52b. Thus, if there are no defects in the coil assembly 32, substantially no current flows between coils 37a and 37b and coils 37a and 37b are effectively isolated from all other coils in the coil assembly 32. Therefore, since the coils 37a and 37b are of substantially equal inductance, the waveforms measured across isolated coils 37a and 37b are substantially equivalent and correspond to the inductance of the coils 37a and 37b.

Where an insulation defect exists in one of the coils of the coil assembly 32, the defective coil will have a lower inductance than its opposite, preferably diametrically opposite, coil and current will flow through the previously isolated coils. If an insulation defect exists in coil 37a, for example, the waveform across the good coil, coil 37b, will be a function of the inductance of all the remaining coils in the coil assembly 32 connected in series, with the series connected coils being connected in parallel to the good coil, coil 37b. Similarly, the waveform across the bad coil, coil 37a, will be a function of the inductance of all the remaining coils of the coil assembly 32 connected in series, with the series connected coils being connected in parallel to the bad coil, coil 37a. Thus, when an insulation defect exists in one of the coils under test, the waveforms measured across the coils under test are no longer substantially equivalent.

Waveform measurement circuits 60 are provided to produce a signal indicative of the waveforms at 60a and 60b. The measurement circuits 60 each include a half-wave rectifying diode 54a, 54b, and an integration circuit comprising a resistor 56a, 56b and a capacitor 58a, 58b. The resulting signals at 60a and 60b are basically the product of the applied voltage and time and are passed to the controller 40 which computes a differential percentage value based on the signals at 60a and 60b. The differential percentage value is determined by calculating the absolute value of the difference between the signals at 60a and 60b, dividing the difference by the greater of the two signals, and multiplying by one hundred to arrive at a percentage value.

It is contemplated that other calculation methods may be employed in the present invention to arrive at a value indicative of the percentage difference between the signals at 60a and 60b. It is further contemplated that, in some applications of the present invention, it may be sufficient to merely calculate the difference, as opposed to the percentage difference, between the signals at 60a and 60b, depending on the level of sensitivity required in the specific testing context.

If the differential percentage value exceeds a predetermined differential percentage limit value, an insulation defect alarm is displayed at a display 62. For example, a differential percentage limit value may typically be set at approximately 5.0%. Then, if a differential percentage value exceeds the 5.0% limit value, an insulation defect alarm will be displayed at the display 62. Of course, the limit values used will depend upon specific applications of the present invention. The display 62 may also be used to display raw data obtained during operation of the testing circuit 30.

In one embodiment, the coil assembly 32 is indexed until each coil has been pulsed and a differential percentage value corresponding to each index position has been stored. For example, each opposed, preferably diametrically opposed, pair of coils is pulsed by activating the SCR 46 and a corresponding differential percentage value is stored in the controller 40. Subsequently, any one of the indexed differential percentage values may be compared with a predetermined differential percentage limit value to determine if an insulation defect exists in one of the pulsed coils.

Alternatively, the maximum stored differential percentage value alone may be selected from the indexed differential percentage values and compared to the limit value. If the maximum value exceeds the limit value of, e.g., 5.0%, an insulation defect alarm is displayed. When comparing the maximum value alone, as opposed to each differential percentage value, each differential percentage value need not be compared to the limit value in order to determine if a defect exists in the coil assembly 32.

Figure 1:
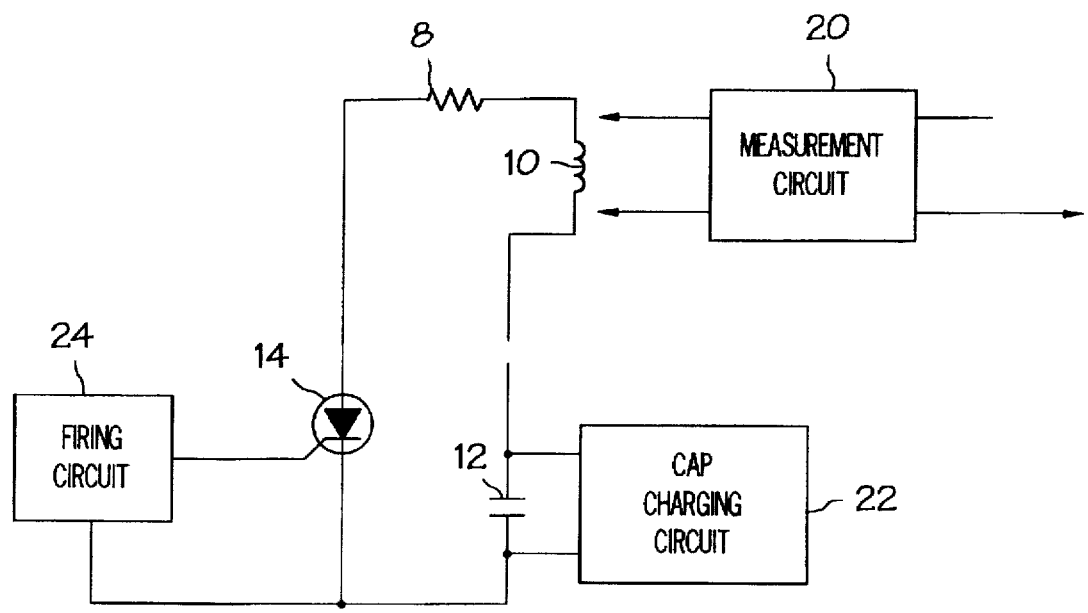
FIG. 1 is a schematic block diagram of a prior art coil surge testing circuit.
Figure 2:
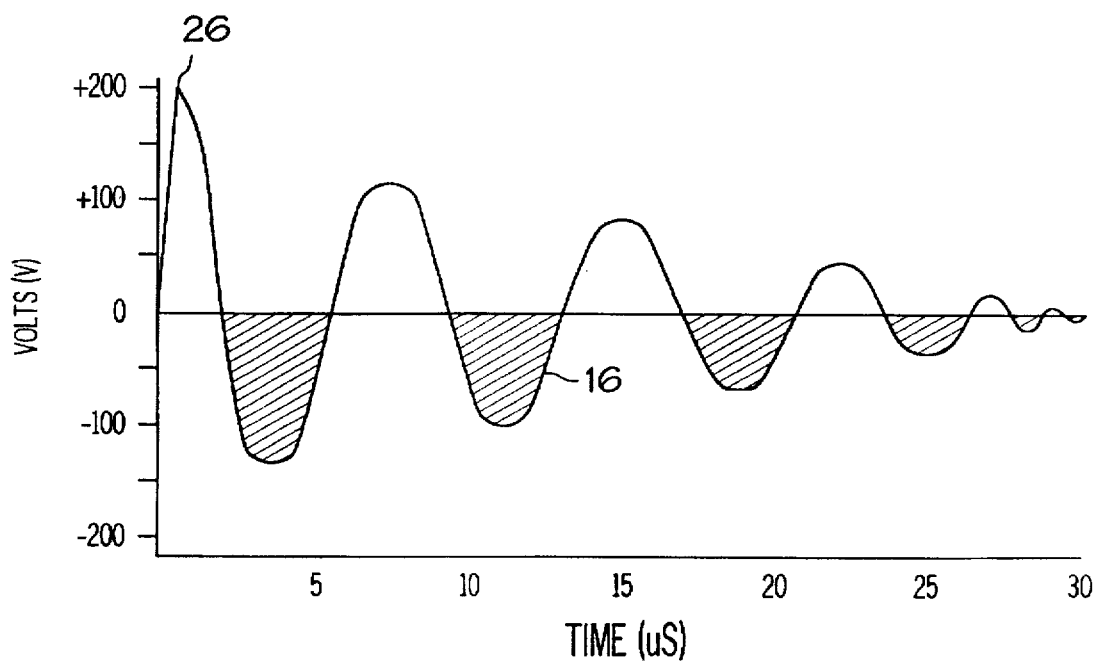
FIG. 2 is graph displaying voltage versus time for a response generated by applying a charged capacitor to a good coil of a coil assembly.

It is believed that the circuit arrangement depicted in FIG. 3 provides a more sensitive means of detecting insulation defects than the prior art circuit depicted in FIG. 1. Further, the circuit arrangement of FIG. 3 provides a greater testing capability because two coils are tested simultaneously, and because a maximum differential percentage value may be selected from the indexed differential percentage values and compared to the limit value, eliminating the need to analyze each measured value for each coil.

Having described the invention in detail and by reference to preferred embodiments thereof, it will be apparent that modifications and variations are possible without departing from the scope of the invention defined in the appended claims.

What is claimed is:

1. A method for detecting insulation defects in a coil assembly including a plurality of coils connected in series to form a closed series connected loop of coils, said method comprising the steps of:

applying a first voltage pulse to a first coil of said coil assembly;

applying a second voltage pulse to a second coil of said coil assembly, said first and second coils being substantially diametrically opposite to one another, and said first and second voltage pulses being substantially equal to one another and oppositely poled relative to said coil assembly;

monitoring a first voltage waveform across said first coil;

monitoring a second voltage waveform across said second coil;

forming a first signal from said first voltage waveform;

forming a second signal from said second voltage waveform;

computing a differential percentage value based on said first signal and said second signal; and determining an insulation defect in said first and second coils of said coil assembly based upon said differential percentage value.

2. A method for detecting insulation defects in a coil assembly as claimed in claim 1 further comprising the steps of:

indexing said coil assembly until all coils of said coil assembly have been pulsed;

storing differential percentage values for each index of said coil assembly; and comparing at least one of said differential percentage values to a predetermined differential percentage limit value, said step of determining an insulation defect in said coil assembly being based on said comparison.

3. A method for detecting insulation defects in a coil assembly as claimed in claim 2 wherein a maximum differential percentage value is selected from all stored differential percentage values, and said maximum differential percentage value is compared to said predetermined differential percentage limit value, said step of determining an insulation defect in said coil assembly being based on said comparison.

4. A method for detecting insulation defects in a coil assembly as claimed in claim 1 wherein said steps of applying a first voltage pulse to a first coil of said coil assembly and applying a second voltage pulse to a second coil of said coil assembly comprise the steps of:

charging a first capacitor;

charging a second capacitor, said first and second capacitors being charged by a common charge source; and simultaneously connecting said first capacitor across said first coil of said coil assembly and said second capacitor across said second coil of said coil assembly through a common switching device.

5. A method for detecting insulation defects in a coil assembly as claimed in claim 1 wherein the steps of forming said first and second signals comprise the steps of rectifying and integrating said first and second waveforms, respectively.

6. A method for detecting insulation defects in a coil assembly as claimed in claim 1 wherein the steps of computing, comparing and determining are performed by a microprocessor.

7. A method for detecting insulation defects in a coil assembly as claimed in claim 1 wherein said predetermined differential limit value is indicative of a maximum surge differential limit for a coil assembly.

8. Apparatus for testing a coil assembly including a plurality of coils connected in series to form a closed series connected loop of coils, said apparatus comprising:

a first capacitor having first and second terminals, said first terminal of said first capacitor being connectable to a first side of a first coil of said coil assembly;

a second capacitor having first and second terminals, said first terminal of said second capacitor being connectable to a first side of a second coil of said coil assembly, said second terminals of said first and second capacitors being connected to one another at a junction point;

a common charging circuit connected to said first and second capacitors for charging said first and second capacitors;

a switching device having first and second terminals, said first terminal of said switching device being connected to said junction point, and said second terminal of said switching device being connectable to a second side of said first coil and a second side of said second coil, said first and second capacitors being poled such that, when said second terminals of said first and second capacitors are connected to said second side of said first and second coils through said switching device, capacitor discharge voltages applied to said first and second coils oppose one another within said coil assembly;

a first measurement circuit connectable to said first coil;

a second measurement circuit connectable to said second coil; and a controller for controlling said common charging circuit and said switching device and for receiving and analyzing first and second signals generated, respectively, by said first and second measurement circuits to generate a differential percentage value based on said first and second signals to thereby identify insulation defects in said first and second coils of said coil assembly.

9. Apparatus for testing a coil assembly as claimed in claim 8 wherein said first and second measurement circuits each comprise a rectifier circuit and an integrator circuit.

10. Apparatus for testing a coil assembly as claimed in claim 8 wherein said controller comprises a microprocessor.

11. A method for testing a coil assembly including a plurality of coils connected in series to form a closed series connected loop of coils, said method comprising the steps of:

connecting a first voltage pulse across a first coil of said coil assembly;

simultaneously connecting a second voltage pulse across a second coil of said coil assembly, said first and second voltage pulses being poled to oppose each other within said coil assembly;

rectifying and integrating the resulting oscillatory signal generated across said first coil to generate a first signal;

rectifying and integrating the resulting oscillatory signal generated across said second coil to generate a second signal;

subtracting said second signal from said first signal and dividing the result by the larger of said first and second signals to obtain a differential percentage value for said first and second coils; and determining an insulation defect in said first and second coils of said coil assembly based on said differential percentage value.

12. A method for testing a coil assembly as claimed in claim 11 further comprising the steps of:

indexing said coil assembly until all coils of said coil assembly have been connected to said first or second voltage pulse;

storing differential percentage values for each index of said coil assembly; and comparing at least one of said differential percentage values to a predetermined differential percentage limit value, said step of determining an insulation defect in said coil assembly being based on said comparison.

13. A method for testing a coil assembly as claimed in claim 12 wherein a maximum differential percentage value is selected from all stored differential percentage values, and said maximum differential percentage value is compared to said predetermined differential percentage limit value, said step of determining an insulation defect in said coil assembly being based on said comparison.

14. A method for testing a coil assembly as claimed in claim 11 wherein said steps of connecting a first voltage pulse across a first coil of said coil assembly and simultaneously connecting a second voltage pulse across a second coil of said coil assembly comprise the steps of:

charging a first capacitor;

charging a second capacitor, said first and second capacitors being charged by a common charge source; and simultaneously connecting said first capacitor across said first coil of said coil assembly and said second capacitor across said second coil of said coil assembly through a common switching device.

* * * * *